(12) United States Patent
Stockton (10) Patent No.: US 6,509,800 B2
(45) Date of Patent: Jan. 21, 2003

(54) POLYPHASE NOISE-SHAPING FRACTIONAL-N FREQUENCY SYNTHESIZER

(75) Inventor: David Stockton, Dunfermline (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/825,743

(22) Filed: Apr. 3, 2001

(65) Prior Publication Data

US 2002/0140512 A1 Oct. 3, 2002

(51) Int. Cl.[7] .................................................. H03L 7/00
(52) U.S. Cl. ............................. 331/11; 331/10; 327/115
(58) Field of Search .............................. 331/11, 10, 17, 331/25; 341/143; 375/376; 327/115, 116, 117, 105

(56) References Cited

U.S. PATENT DOCUMENTS

| | | | | |
|---|---|---|---|---|
| 4,888,564 A | * | 12/1989 | Ishigaki | 331/1 A |
| 5,038,117 A | * | 8/1991 | Miller | 331/1 A |
| 5,216,387 A | | 6/1993 | Telewski et al. | 331/11 |
| 5,291,428 A | * | 3/1994 | Twitchell et al. | 327/105 |
| 5,521,948 A | * | 5/1996 | Takeuchi | 331/11 |
| 5,714,896 A | * | 2/1998 | Nakagawa et al. | 327/115 |
| 6,008,703 A | * | 12/1999 | Perrott et al. | 331/16 |

OTHER PUBLICATIONS

Ulrich L. Rohde, "A High–Performance Fractional–N Synthesizer," QEX Forum for Communications Experimenters, Jul./Aug. 1998, pp3–12.

Brian Miller, "A Multiple Modulator Fractional Divider," IEEE Transactions on Instrumentation and Measurement, vol. 40, No. 3, Jun. 1991, pp. 578–583.

David Owen, "A New Approach to Fractional–N Synthesis," Electronic Engineering, Mar. 1990, pp. 35–36, 38.

Dan Baker, "A Reference–Cancelling Phase/Frequency Detector," RF Design, Jul. 1989, pp. 35–40.

* cited by examiner

Primary Examiner—Robert Pascal
Assistant Examiner—Joseph Chang (57) ABSTRACT

A polyphase, noise-shaping, fractional-N frequency synthesizer utilizes multiple, parallel fractional-N divider channels to deliberately decorrelate noise and improve spectral purity. The synthesizer comprises a voltage controlled oscillator (VCO), a reference signal source to produce a plurality of different reference signals, a loop integrator, a plurality of desynchronized divider channels and a signal summer. Each divider channel comprises a frequency divider, a fractional-N control logic and a phase detector. Each divider channel divides an output signal from the VCO by a variable division factor and compares the divided signal to a different reference signal to produce an error signal. The signal summer combines the error signals from the desynchronized divider channels into a combined error signal. The loop integrator integrates the combined error signal to produce a control voltage that is applied to the VCO. The divider channels are desynchronized with respect to one another using time and/or phase shifting techniques.

39 Claims, 4 Drawing Sheets

POLYPHASE NOISE-SHAPING FRACTIONAL-N FREQUENCY SYNTHESIZER

TECHNICAL FIELD

The invention relates to microwave synthesizers. In particular, the invention relates to the synthesis of signals using a fractional-N phase locked loop synthesizer.

BACKGROUND ART

A frequency synthesizer is a signal source device that generates an output signal from one or more reference signals. In general, frequency synthesizers produce a signal consisting of a single frequency selected from among several discrete frequencies available by virtue of the design of the synthesizer. Frequency synthesizers of various forms and designs have been found to be highly useful if not essential in a wide variety of applications including FM radios, radar systems, cellular and PCS telephone systems, and test equipment such as spectrum analyzers and signal generators.

In particular, frequency synthesizers have proven to be essential in modern communications systems. The technical advancements in modern communications and measurement systems are producing an ever-increasing demand for higher levels of performance from the frequency synthesizers used in these systems. The higher levels of performance that are required in modern frequency synthesizers run the full range of typical synthesizer performance specifications, including improved phase noise, better spectral purity, faster frequency switching or tuning speed, and smaller frequency tuning step size specifications. Concomitant with increased performance requirements are market forces surrounding modern communications and measurement systems that are placing demands for lower cost on modern frequency synthesizers.

In general, a frequency synthesizer produces or synthesizes an output signal having a selectable or "tunable" frequency. Although not always, the signal produced is typically at a higher frequency than that of the reference signal(s). The signal generated by a frequency synthesizer is typically a very stable, spectrally pure, single frequency signal having low or sometimes even very low phase noise. However, unlike other signal sources such as voltage controlled oscillators (VCO), a given frequency synthesizer generally is capable of producing only a finite, albeit often large, number of selectable, discrete frequencies as an output signal. The frequency spacing between adjacent selectable frequencies in the output signal is referred to as the "step size" or "frequency resolution" of the synthesizer. Frequency synthesizers are most often used where stepped tuning is acceptable and where the frequency stability/precision and spectral purity are of paramount importance.

A number of different types of frequency synthesizers or methods of frequency synthesis are known in the art including direct frequency harmonic generation, direct digital synthesis (DDS), and phase locked loop (PLL) frequency synthesis. The direct frequency harmonic generation synthesizer utilizes a non-linear device, such as a step recovery diode or comb generator, to produce a large number frequency harmonics of a reference signal source frequency. These harmonics are then used directly or combined with each other to produce a desired output frequency value. The DDS uses a digital to analog converter (DAC) to convert a digital data stream into an analog output signal. The digital data stream is a digital representation of a sampled version of the desired output signal, thus the DDS directly synthesizes the output signal. In a PLL synthesizer, a negative feedback loop is used to compare and "phase lock" the output signal of a tunable frequency source, such as a VCO, to a stable reference signal. When locked, the PLL output frequency is typically a multiple of the reference signal or linear combination of the reference signal and other signals generated by the synthesizer. In addition, there are also hybrid synthesizers that combine one or more of these or other various frequency synthesis approaches.

As is the case with frequency synthesizers in general, there are also many ways to realize a PLL synthesizer. In some applications, a simple single loop approach is acceptable or even preferred. In other instances, more complicated, multiple loop approaches are used. Moreover, it is often advantageous to incorporate harmonic generators and/or a DDS into a PLL, thereby improving the synthesizer performance and/or decreasing the cost. Strictly speaking, while synthesizers with DDS and harmonic generators are properly classed as hybrid synthesizers, common practice is to refer to these as PLL synthesizers, since the PLL is the principle means of synthesizing the output signal.

Figure 1:
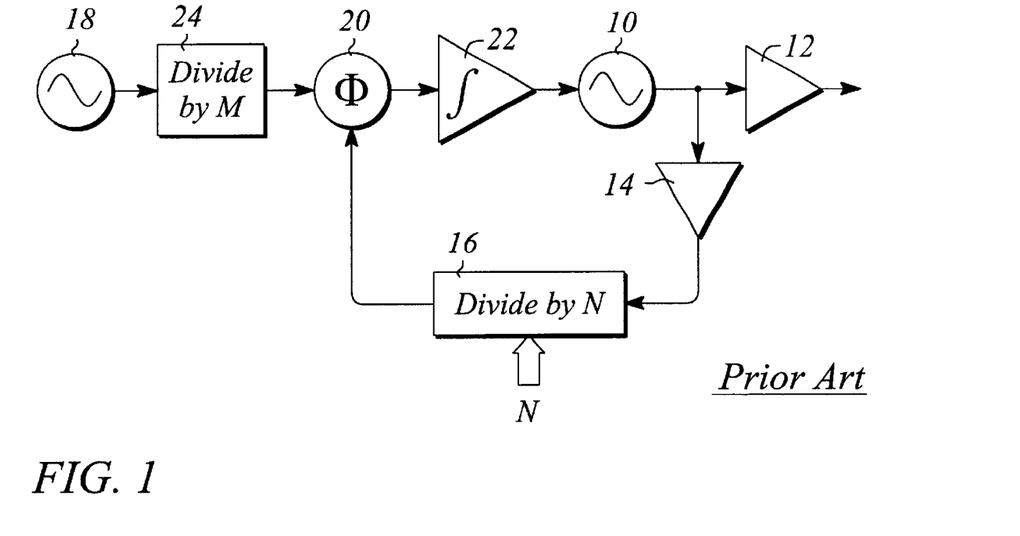
FIG. 1 illustrates a block diagram of a basic, single loop, phase locked loop based frequency synthesizer of the prior art.

FIG. 1 illustrates a block diagram of a basic, single loop PLL synthesizer (SLS) used to synthesize a signal from a stable reference signal. The basic SLS comprises a voltage-controlled oscillator (VCO) 10, a loop frequency divider 16, a reference oscillator 18, a phase/frequency comparator or detector (PFD) 20, and a loop integrator or loop filter/amplifier 22. Often a reference frequency divider 24 is included between the reference oscillator 18 and the PFD 20. The VCO 10 produces an output signal, the frequency of which is proportional to an input control voltage. The output signal produced by the VCO 10 is divided by the frequency divider 16 to create a lower frequency signal. The frequency dividers 16, 24 are apparatuses that accept a signal at a frequency f and produce an output signal at a frequency f/N f/M, where N and M are integer division factors, of the frequency dividers 16, 24, respectively.

The signal produced by the frequency divider 16 is compared by the PFD 20 to a divided reference frequency signal produced by the reference frequency divider 24 acting on a reference signal from the reference oscillator 18. The PFD 20, in turn, produces an error voltage signal that is proportional to the phase/frequency difference between the frequency of the output signal of the frequency divider 16 and the divided reference signal frequency fref/M, where M is the division factor of the reference frequency divider 24. The error voltage is integrated by the loop integrator 22 to produce the input control voltage that is applied to the VCO 10.

In some implementations, an output amplifier 12 and a loop amplifier 14 are included in the basic SLS. The output amplifier 12 is used to amplify the output signal produced by the SLS. The loop amplifier 14 is used to amplify the portion of the output signal that is used by the frequency divider 16. The loop amplifier 14 also provides a reverse isolation between the frequency divider 16 and the SLS output.

The action of the negative feedback loop of the PLL eventually causes or forces the error voltage to equal zero. In essence, the VCO 10 output signal is automatically adjusted by the feedback loop until the frequency of the divided signal produced by the frequency divider 16 equals the frequency of the reference signal. When the error voltage has been made equal to zero by the action of the feedback loop, the loop is said to be "locked" to the reference source. When locked, the loop maintains the relationship of equation (1).

$$f=f_{ref}*(N/M) \quad (1)$$

The frequency f of the output signal can be changed by changing either the integer division factor N of the loop divider 16 or the reference signal frequency and/or the integer division factor M of the reference divider 24. Generally but not always, the reference signal frequency and reference divider division factor M are fixed and the loop division factor N is changed to affect tuning in a single loop frequency synthesizer (SLS). In other words, tuning of the synthesizer is accomplished by changing the value of N or an equivalent control instruction that is applied to a control input on the loop divider 16.

The basic SLS has a major performance limitation in that the phase noise produced by the SLS is essentially proportional to the phase noise of the reference source multiplied by the combined division factor N/M. The higher the loop division factor N the more phase noise is produced by the SLS. This implies that a higher fref and/or lower reference division factor M should be used for lower phase noise. On the other hand, the minimum step size achievable in the basic SLS is equal to the reference frequency implying that a lower fref and or higher reference division factor M be used.

For example, if the frequency fref of the reference signal equals 10 MHz and reference division factor M equals 2, N must be equal to 1000 in order to synthesize an output signal with a frequency f of 5000 MHz and a minimum step size of 5 MHz. On the other hand, if the frequency fref of the reference signal equals 100 MHz, N is only 100, however the minimum step size is 50 MHz. Therefore, the basic SLS design generally requires that a compromise be made between step size and phase noise performance. Similarly, the basic SLS design requires compromises in terms of spectral purity and tuning speed. In short, a simple, single loop PLL synthesizer can offer only coarse frequency resolution, without being severely compromised in terms of spectral purity and tuning speed.

To overcome these limitations, in particular to overcome the limitations associated with a trade-off between the step size and the division factor-related phase noise, several innovations in PLL design have been devised. Multiple loop synthesizers seek to overcome some or all of the limitations by cascading several PLLs to achieve good performance in several, albeit conflicting, performance areas with a penalty of greater analog component complexity. The analog complexity greatly increases the cost of multiple loop PLL designs as compared to that of the basic SLS. A different and often attractive approach to overcoming some of the performance limitations of the basic SLS performance is embodied in the so-called "fractional-N" frequency synthesizer.

Figure 2:
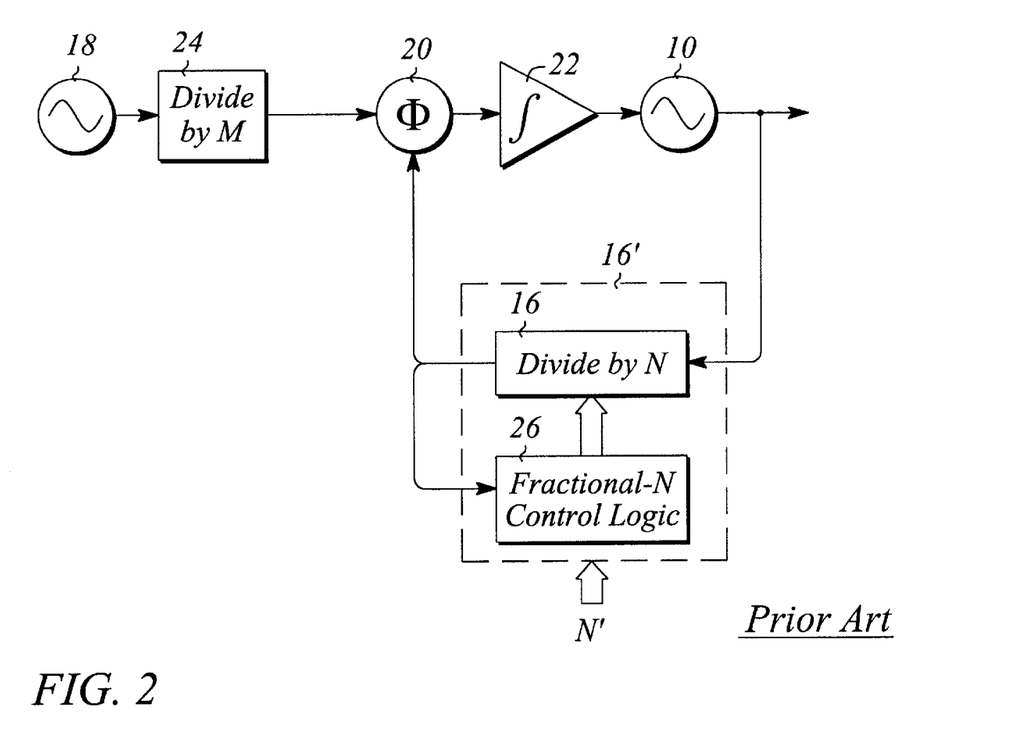
FIG. 2 illustrates a block diagram of a conventional, fractional-N synthesizer.

The fractional-N frequency synthesizer comprises the elements of the basic SLS with the loop frequency divider 16 replaced by a fractional-N divider 16', as illustrated in FIG. 2. The fractional-N divider 16' is a divider that has an effective fractional division factor N, comprising an integer part N and a fractional part A. Typically, a fractional-N divider 16' comprises a conventional loop frequency divider 16 and a fractional-N control logic circuit 26. The fractional-N frequency division is realized by periodically varying the division factor N of the conventional frequency divider 16 under the control of the fractional-N control logic circuit 26, such that the time-average frequency division of the divider equals the desired fractional division fractional-N division factor N'. Often this variation of the division factor consists of periodically adding one to the division factor N (i.e. periodically switching between a division factor of N and N+1 and back again).

For example, consider the case where a fractional division factor N'=1000.01 is desired. The integer part of the desired fractional division factor is N=1000 while the fractional part is $\Delta$=0.01. The desired fractional division factor N'=N+$\Delta$ can be approximated in a time-average sense by setting the division factor of the divider 16 such that N=1000 and then periodically switching the division factor to N+1=1001 for a period of time and then back to N=1000. If the switch to the N+1 division factor occurs for one cycle in every 100 cycles of the reference signal, the resulting average division factor is the desired fractional division factor N'=1000.01. In fact, by varying the ratio of the time at which the loop divider is set to N and N+1, respectively, the average fractional division factor N' can assume any fractional value between N and N+1. Furthermore, since by equation (1), the frequency of the output of a PLL is determined by the division factor of the loop divider 16', the average frequency of the PLL will be favg=fref*(N'/M).

A conventional approach to implementing such a fractional-N frequency synthesizer utilizes an accumulator as part of the fractional-N control logic circuit 26. The accumulator is often a clocked or synchronous digital adder with its output connected to one of its inputs. The accumulator adds an output or sum value to an input value with an addition occurring once every clock cycle. As with all digital adders, there is a maximum value that can be represented in the adder/accumulator that depends on the number of bits used by the adder. The maximum value that can be represented is max=$2^n$–1 where n is the number of bits in the adder/accumulator. If an addition operation in an accumulator results in a value that is beyond the maximum value, the accumulator overflows. When an accumulator overflows, the accumulator asserts an overflow or carry output, sometimes called a 'carry bit', and the sum value of the adder/accumulator 'rolls over' to a remainder value rem. The remainder value is the sum value sum that would have resulted from the addition in question minus the maximum value max that can be represented by the adder/accumulator plus one (i.e. rem=sum–max+1=sum–$2^n$).

For example, consider an accumulator that can represent values from 0 to 15 (i.e. 4-bit accumulator where n=4) and that has an input value of 6. If the accumulator is started at '0' and clocked 6 times, the output values at each clock cycle will be 0, 6, 12, 2, 8, 14, ... with the carry bit being asserted at the fourth clock cycle. Typically, the carry is asserted during a clock cycle if the accumulator overflows during that clock cycle. Another way of viewing the operation of an accumulator is as a counter that counts in increments of the input value and rolls over when the maximum value max is reached.

The frequency divider 16 is set to the integer portion N of the fractional division factor N', while the input value applied to the accumulator is based on the fractional part $\Delta$. The overflow output is connected to the frequency divider 16, such that when set (i.e., when an overflow occurs), one is added to the value N in the divider 16. Typically, the accumulator is clocked with either the divided reference signal (as illustrated in FIG. 2) or the divided frequency output of the loop divider 16.

At each cycle of the clock signal (e.g. divided reference signal), the accumulator adds a current accumulator value to the input value. The input value determines how often the accumulator overflows and cycles back to zero. At each overflow event, the division factor of the loop divider 16 is switched from N to N+1 for one cycle and then back to N at the next cycle. Essentially, the accumulator counts the number of clock cycles and determines, based on the input value, when to switch the division factor of the divider from N to N+1 and back again.

With a fractional-N synthesizer, higher reference signal frequencies fref can be used to improve phase noise while simultaneously maintaining a very small step size for the synthesized output signal. Therefore, the basic fractional-N synthesizer achieves excellent frequency resolution, low phase noise, and good tuning speed, while simultaneously minimizing the cost associated with additional analog components, compared to the basic SLS. The only essential additional components in the fractional-N synthesizer are the accumulator and some simple switching logic in the divider 16, both of which are generally implemented using relatively low cost digital technology.

Unfortunately, the basic fractional-N synthesizer typically suffers from poor spectral purity. The switching of the division factor of the loop divider 16 between N and N+1 tends to produce a phase error or phase modulation that ultimately manifests itself as spurious signal energy or phase noise in the sidelobes in the power spectrum of the synthesized output signal of the PLL.

The spurious signals and phase noise produced by the fractional-N divider 16' are difficult to remove or attenuate from the output signal of the synthesizer, in part because the noise spectrum changes with every value of N'. Analog techniques, such as filtering and cancellation, have been used in attempts to reduce the amplitudes of unwanted spurious signals and phase modulations in the output signals of fractional-N synthesizers with marginal success. Typically, the success of such analog cancellation techniques is limited by the accuracy and stability achievable in analog components. Analog techniques are also invariably costly due to the need for high precision analog components.

An attractive, alternative technique to analog cancellation for addressing the spectral purity problems of the basic fractional-N synthesizer is known as "noise-shaping". Adding the noise-shaping technique to a fractional-N divider in a PLL synthesizer yields the so-called 'noise-shaping, fractional-N synthesizer'. Instead of attempting to cancel or attenuate unwanted phase modulation and spurious signals, the noise-shaping approach simply redistributes and moves this noise away from a center frequency of the output signal. By moving the unwanted spectral noise components in the sidelobes away from the fundamental signal frequency, the natural limited bandwidth of the PLL acts as a tracking filter to remove much of these components from the output signal.

In the noise-shaping, fractional-N synthesizer, the division factor N is varied or modulated in a pseudo-random fashion with respect to time. The variation of N is generally accomplished by a noise-shaping, fractional-N control logic circuit, typically a digital system. The noise-shaping fractional-N control logic essentially generates a time sequence of division factors N or more correctly, a time sequence of division factor control instructions, for the frequency divider 16. By selecting an appropriate pseudo-random distribution function for the sequence of the division factor N, the variation of N can be made to affect both the center frequency of the PLL output signal and the power spectral density (PSD) of the sidelobes of the output signal. That is, the desired fractional-N division factor N' can be realized while simultaneously reducing the power levels of the sidelobes of the output signal. It is the sidelobes of the PSD of the PLL output signal that contain the unwanted phase modulation and spurious signals.

In simple terms, the mean value or average value of the division factor sequence, namely the fractional division factor N', establishes the center frequency of the output signal of the PLL. The distribution function of the variation of the division factor controls the shape of the sidelobes of the PSD surrounding the center frequency. The result is that the noise-shaping, fractional-N synthesizer produces an output signal with a frequency given by equation (2).

$$f=fref*(X/M) \qquad (2)$$

where X is the mean value of the distribution function controlling the variable division factor N. In general, the mean value X can have an integer part N and a fractional part Δ and so the mean value X is equivalent to the fractional division factor N' discussed hereinabove.

Normally, the goal of the selection of the pseudo-random sequence is to choose a sequence that moves much of the unwanted spectral energy away from the fundamental output frequency so that the limited bandwidth of the PLL can remove it. Moreover, the spectral purity is greatly improved through the intentional phase modulating affects of the application of the pseudo-random sequence to the control of the division factor N.

Figure 3:
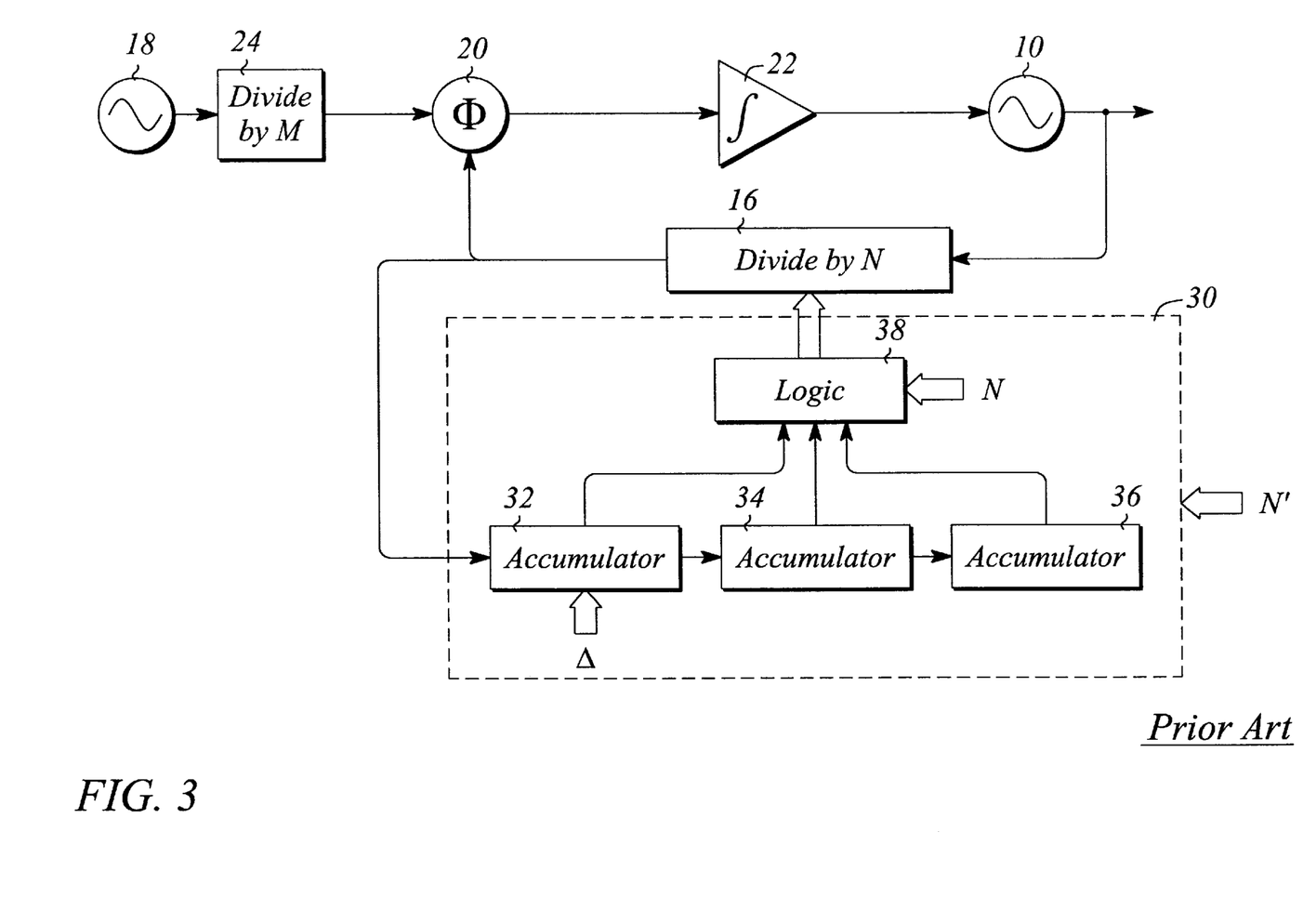
FIG. 3 illustrates a block diagram of a conventional, noise-shaping, fractional-N synthesizer.

FIG. 3 illustrates a block diagram of a conventional noise-shaping, fractional-N synthesizer that utilizes multiple cascaded accumulators as part of the fractional-N control logic 30. While the block diagram of FIG. 3 illustrates the use of three cascaded accumulators, conventional fractional-N synthesizers that use two or more cascaded accumulators are known in the art. The cascaded accumulators can produce a sufficiently random division factor sequence to realize the goals of noise-shaping.

As with the fractional-N synthesizer of FIG. 2, an input value derived from the fractional part of the desired fractional division factor N' is applied to an input of a first accumulator 32. An output of the first accumulator 32 feeds an input to the second accumulator 34 and an output of the second accumulator 34 feeds an input to the third accumulator 36. Overflow bit outputs from each of the accumulators 32, 34, and 36 are applied to a logic circuit 3 8 that accepts an integer part of the fractional division factor and determines the appropriate control input for the loop divider 16.

The logic circuit 38, upon receiving an overflow indication from the first accumulator 32, causes the loop divider 16 to switch between a division ratio of N and N+1 and back to N on successive cycles of the clocking signal. Thus, as in the basic fractional-N divider, the desired fractional division factor N' is achieved as described hereinabove. Upon receiving an overflow indication from the second accumulator 34, the logic circuit 38 causes the division factor N of the loop divider 16 to switch from N to N+1 for one cycle and then a switch to N−1 for a subsequent cycle followed by a return to N. Finally, upon receiving an overflow indication from the third accumulator 36, the logic circuit 38 causes the division factor N of the loop divider 16 to switch from N to N+1, followed by a switch to N−2, and then a switch to N+1 again after which the division factor returns to N. The affect that switching the division factor N' as a result of the overflow of the second and third accumulators 34, 36, has on the average division factor N' of the loop divider is zero. However this switching does affect the instantaneous phase error and thus tends to spread or move the phase noise associated with the fractional-N divider away from the center frequency of the output signal of the synthesizer.

While noise-shaping, fractional-N synthesizers exhibit much improved spectral purity compared to the basic fractional-N synthesizer, the spectral purity is still not comparable to that of the basic SLS or of multiple loop PLLs. Generally, practical limitations in loop bandwidth and component performance prevent the noise-shaping approach from achieving sufficiently improved spectral purity to allow the conventional, noise-shaping, fractional-N synthesizer to compete with the basic SLS and various multi-loop approaches in many applications. On the other hand, noise shaping, fractional-N synthesizers can be very cost competitive, since the bulk of the complexity introduced by adding noise-shaping is digital in nature.

Accordingly, it would be advantageous to have a microwave synthesizer apparatus that achieved spectral purity performance better than that of the basic SLS, while achieving fine frequency resolution normally associated with the noise-shaping, fractional-N synthesizer. In addition, it would be desirable if the level of achievable spectral purity could be easily traded-off against the increased level of cost and complexity. Such a microwave synthesizer apparatus would solve a long-standing need in the area of microwave signal synthesis.

SUMMARY OF THE INVENTION

The present invention provides a novel noise-shaping, fractional-N synthesizer having better spectral purity than a basic SLS or conventional noise-shaping fractional-N synthesizer while still maintaining the fine frequency resolution of the fractional-N approach. The noise-shaping, fractional-N synthesizer of the present invention utilizes multiple, parallel fractional-N divider/detector channels to deliberately decorrelate the noise and improve spectral purity. Moreover, the level of achievable spectral purity of the synthesizer of the present invention is progressive and controllable as a function of the cost and complexity level of the synthesizer.

The synthesizer of the present invention comprises a voltage controlled oscillator (VCO) that generates an output signal Fout at a VCO output, a reference signal source that generates a plurality of reference signals and a loop integrator. The synthesizer of the present invention further comprises a plurality of desynchronized divider channels. Each divider channel receives and divides a sample of the signal Fout by a variable division factor N to produce a divided signal Fdiv. Each divider channel further compares the divided signal Fdiv to a different one of the plurality of reference signals received by each of the divider channels to produce an error signal Verr. The error signal is a measure of the phase/frequency difference between the divided signal Fdiv and the reference signal. The synthesizer of the present invention combines the error signals Verr produced by the plurality of divider channels to produce a combined error signal. The loop integrator receives the combined error signal and integrates the combined error signal to produce a control voltage that is applied to a VCO input, thereby controlling the frequency of the output signal Fout produced by the VCO.

The divider channels of the present invention are purposely desynchronized with respect to one another. The plurality of desynchronized divider channels produce a plurality of error signals Verr having unwanted phase error or phase modulations that are largely decorrelated. Therefore, when these error signals Verr are combined or summed together, the phase errors tend to cancel each other resulting in an overall improvement in the spectral purity of the output signal Fout of the synthesizer.

The present invention offers progressive, controllable improvement in spectral purity and phase noise at the expense of progressively greater complexity of the digital portions. In addition, the synthesizer of the present invention is complimentary to existing, conventional methodologies for improving phase noise of synthesizers, such as the inclusion of a frequency discriminator in a loop around the VCO of a PLL to reduce phase noise from the VCO itself. The synthesizer of the present invention reduces noise from the fractional-N process and also from the phase detector.

Moreover, the synthesizer of the present invention provides advantages in terms of loop bandwidth equivalent those associated with the use of higher reference frequencies. Tuning information from the phase detector system in the synthesizer of the present invention is sampled at a multiple of the reference frequency. Where the system includes a provision for intentional, digital implemented, frequency or phase modulation, a greater modulation bandwidth is made possible by the multiplication of the effective sample rate.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a novel microwave fractional-N synthesizer wherein a plurality of desynchronized, noise-shaping, fractional-N divider channels are employed in parallel in a phase locked loop (PLL). The plurality of desynchronized divider channels produces a plurality of error signals in which unwanted phase error or phase modulations are largely decorrelated with respect to each other. Therefore, when these error signals are combined or summed together, the phase errors tend to cancel each other, resulting in an overall improvement in the spectral purity of the output signal of the synthesizer.

The novel use of a plurality of desynchronized, noise-shaping, fractional-N divider channels in parallel in a single fractional-N PLL synthesizer improves the spectral purity performance compared to that of the conventional noise-shaping, fractional-N synthesizer. Moreover, the number of noise-shaping, fractional-N divider channels of the present invention selectively controls the degree to which the spectral purity is improved. Thus a trade-off can be made between cost/complexity and spectral purity by determining how many divider channels to include in the synthesizer. Desynchronization of the fractional-N divider channels and the resulting decorrelation of the fractional-N related phase modulations in the error signals produced by the divider channels can be achieved using several approaches. Two preferred approaches are described hereinbelow. A first desynchronization approach comprises essentially time-shifting or phase-shifting the relative starting times of a pseudo-random sequence used in the divider channels. The novel noise-shaping, fractional-N synthesizer of the present invention in which the desynchronization is achieved by phase-shifting the channels relative to each other is referred to herein as a polyphase, noise-shaping, fractional-N synthesizer. A second desynchronization approach comprises essentially applying different pseudo-random sequences to each of the divider channels. The two preferred approaches are described in more detail hereinbelow. Other approaches to desynchronization, including but not limited to combining aspects of the first and second approaches, using different order, fractional-N dividers within parallel channels, and adding small, random values to a second accumulator in each channel are possible and all are within the scope of the present invention.

Figure 4:
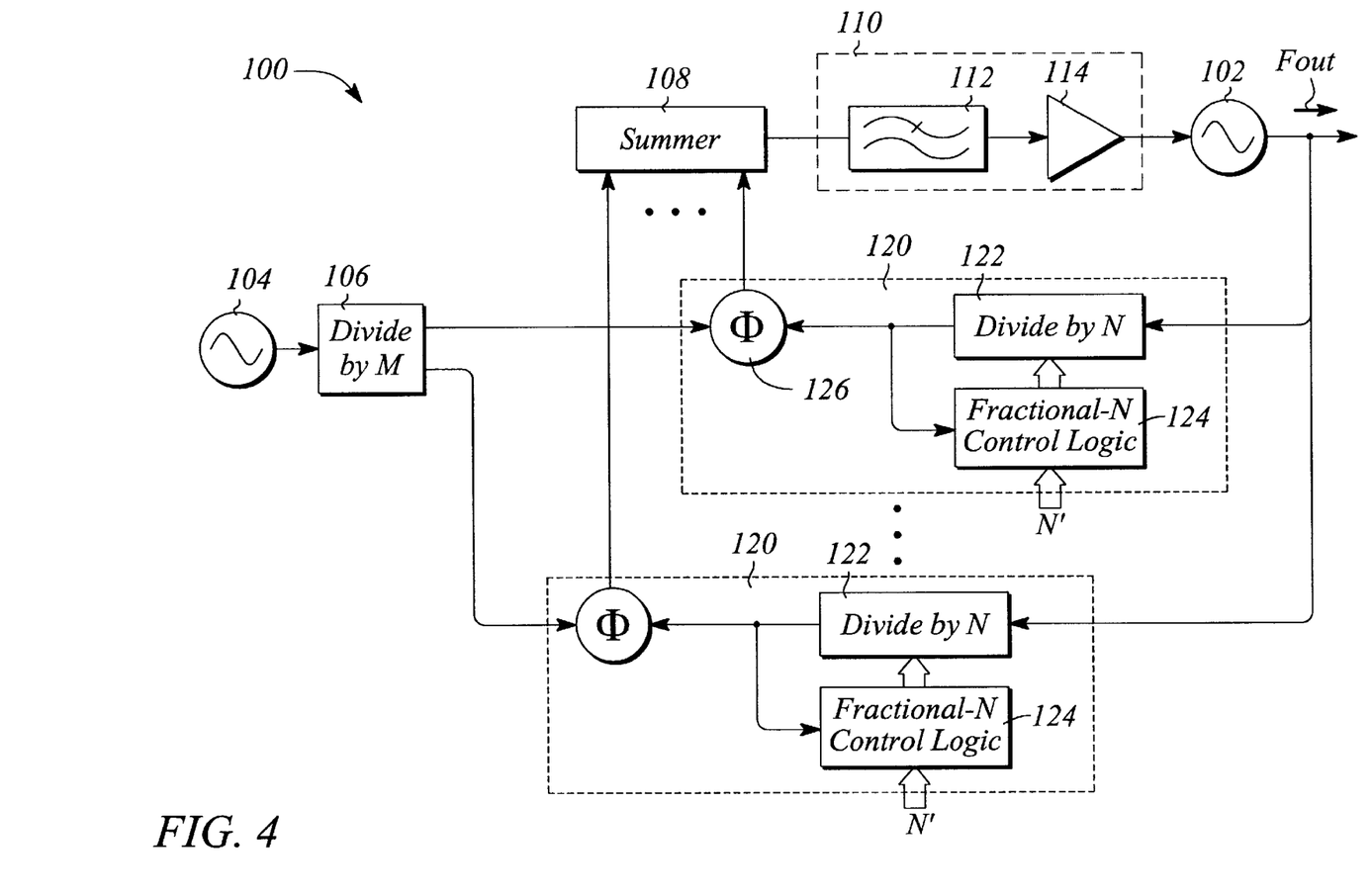
FIG. 4 illustrates a block diagram of a polyphase, noise-shaping, fractional-N synthesizer of the present invention.

FIG. 4 illustrates a block diagram of a polyphase, noise-shaping, fractional-N synthesizer of the present invention. The polyphase synthesizer 100 comprises a voltage controlled oscillator (VCO) 102, a reference signal source 104, a reference source frequency divider 106 having a division factor M, an error signal summer 108, and a loop integrator 110. In the preferred embodiment, the loop integrator 110 comprises a loop filter 112 and a loop amplifier 114. Preferably, the loop filter 112 is a lowpass filter. Although not required, the VCO 102, the reference signal source 104, the reference source divider 106, and the loop integrator 110 advantageously can be the same or similar to those used in a conventional SLS synthesizer.

Referring to FIG. 4 again, the synthesizer 100 of the present invention further comprises a plurality of noise-shaping, fractional-N divider channels 120. The noise-shaping fractional-N divider channels 120 are hereinafter referred to as divider channels 120. Each divider channel 120 comprises a frequency divider 122 having a controllable division factor N' a fractional-N control logic 124 for controlling the division factor N' and a phase detector 126. The plurality of divider channels 120 is connected in parallel in the synthesizer 100. The frequency divider 122, the fractional-N control logic 124 and the phase detector 126 advantageously can be the same or similar to those used in a conventional noise-shaping, fractional-N synthesizer.

The error signal summer 108 may be implemented explicitly as a separate component as illustrated in FIG. 4, or implicitly, in the synthesizer 100 of the present invention. For example, if the phase detectors 126 of the divider channels 120 have current or pulsed current output signals, the outputs of the phase detectors 126 can be wired together to perform current summation directly without the need for a separate, explicit error signal summer 108. One skilled in the art would readily recognize that directly wiring together outputs of the phase detectors 126, where the phase detectors 126 have current or pulsed current outputs, is functionally equivalent to having an error signal summer 108. Therefore, both explicit and implicit implementations of the error signal summer 108 are within the scope of the present invention.

The VCO 102 produces an output signal Fout at a frequency fout. A sample of the output signal Fout is applied to a first input of each of the divider channels 120 of the plurality. Within each of the divider channels 120, the signal Fout is frequency divided by the frequency divider 122 to produce a signal Fdiv at an instantaneous frequency fdiv given by equation (3).

$$fdiv = fout/N \qquad (3)$$

where N is the variable division factor of the frequency divider 122. The variable division factor N is controlled by the fractional-N control logic 124 of the divider channel 120. The fractional-N control logic 124 is preferably a clocked circuit and produces a sequence of division factors N' one for each cycle of a clock signal.

A fractional division factor N' value is applied to all of the divider channels 120. The fractional division factor N' has an integer part N and a fractional part Δ, as is described above, and is used by the fractional-N control logic 124 of each divider channel 120 to determine a time sequence of the division factors N. The time sequence of division factors N is a pseudo-random, noise-shaped sequence with a mean value equal to N'.

The signal Fdiv is applied to a first input of the phase detector 126. In the preferred embodiment, the signal Fdiv is also applied to an input of the fractional-N control logic 124 as the clock signal to facilitate logic timing. Alternatively, a reference signal produced by the reference source 104 and the reference divider 106 can be used for the clock signal. The use of the signal Fdiv as the clock signal is preferred since it tends to avoid so-called 'logic hazards' in the linkage between the fraction-N control logic 124 and the frequency divider 122.

The reference source 104 produces a reference signal Fref at a frequency fref The reference signal Fref is applied to an input of the reference divider 106 wherein the reference signal Fref is frequency divided by M to produce a plurality of divided reference signals Frdiv each at a frequency frdiv=fref/M. One of each of the divided reference signals Frdiv is applied to one of each of the plurality of fractional-N divider channels 120. Within each of the divider channels 120, the divided reference signal Frdiv is applied to a second input of the phase detector 126.

The phase detector 126 of each of the plurality of divider channels 120 produces an error signal Verr. The error signal Verr represents the phase difference between the signal Fdiv and the divided reference signal Frdiv. The error signals Verr produced by the phase detectors 126 are added or summed together in the summer 108 or implicitly, as described above. The summed error signals are then integrated by the loop integrator 110 to generate a control signal. The control signal is applied to a control input of the VCO 102, thereby closing a feedback control loop that serves to phase lock the VCO output signal Fout to a fractional-N value of the reference source frequency fref.

In the preferred embodiment of the synthesizer 100 of the present invention, each of the divider channels 120 is desynchronized by effectively time-shifting each of the sequences of division factors N controlling the dividers 122, as noted hereinabove. Since a time-shift or time delay is equivalent to a phase shift or phase delay, time-shifting is realized by phase shifting the divided signals Fdiv. Moreover, since the divider channels 120 are noise-shaping, fractional-N divider channels, the references to 'time-shift' and equivalent 'phase shift' herein are understood to be time averaged or mean values and not instantaneous values. The corresponding divided reference signals Frdiv are similarly phase shifted. In other words, each divider channel 120 produces a divided signal Fdiv that is phase shifted by a mean phase value relative to mean phase values of the other divider channels 120 of the plurality. Likewise, the reference divider 106 produces a plurality of divided reference signals Frdiv that are phase shifted relative to each other by an amount corresponding to the divided signals Fdiv.

The plurality of phase shifted divided signals Fdiv and the similarly phase shifted divided reference signals Frdiv are combined in the phase detectors 126 of the plurality of divider channels 120 to produce a plurality of error signals Verr. For example, consider a second divider channel 120 that produces a phase shifted divided signal Fdiv that is phase shifted by 180 degrees relative to the signal Fdiv produced by a first divider channel 120. A second divided reference signal Frdiv that is phase shifted by 180 degrees relative to a first divided reference signal Frdiv is combined with the second signal Fdiv in the phase detector 126 of the second divider channel 120. Likewise for this example, the first signal Fdiv and the first divided reference signal Frdiv are combined in the phase detector 126 of the first divider channel 120. That is to say that the second signal Fdiv and the second divided reference signal Frdiv are phase-offset relative to the first signal Fdiv and the corresponding first divided reference signal Frdiv.

The error signals Verr, one from each divider channel 120, can be considered to be the sum of two sets of signal components. A first set of components, the 'tuning' components, relate to an immediate phase error with respect to an ideal phase value of the VCO 102. The tuning components cover an extensive frequency range and allow the PLL, within the limit of a loop bandwidth, to act to correct for VCO 102 phase noise. Usually, the tuning components of Verr have progressively reducing amplitude with respect to increasing frequencies due to typical inherent phase noise characteristics of the VCO 102. The tuning components are the desired set of components of the error signals Verr.

A second set of components found in each of the error signals Verr are the pseudo-random noise components. The pseudo-random noise components are created by the operation of the noise-shaping fractional-N divider channels 120. As with the tuning components, the pseudo-random components also cover a wide frequency range. However, unlike the tuning components, the pseudo-random components have an amplitude that in generally progressively increases with respect to frequency. The pseudo-random components are the undesirable set of components of the error signals Verr. The choice of loop bandwidth in the synthesizer 100 of the present invention typically represents a compromise between having a large loop bandwidth thus favoring VCO 102 phase-noise reduction and having a small loop bandwidth to best attenuate by filtering the fractional-N noise of the divider channels 120.

When Verr signals from multiple divider channels 120 are summed, the tuning components correlate and add strongly as added voltages. For example, the tuning components of error signals Verr produced by two divider channels 120 add constructively to give resultant summed tuning components having amplitudes that are on the order of 6 dB greater than the amplitudes of the tuning components of the error signal of a single divider channel 120. One skilled in the art would recognize that the gain of the loop amplifier and/or the sensitivity of the VCO 102 should be reduced appropriately to accommodate the increased tuning component levels of the summed Verr signals.

On the other hand, by de-synchronizing the divider channels 120, the pseudo-random noise components of the error signals Verr from different divider channels 120 have little correlation. The pseudo-random components thus add more weakly, generally as added power. For example, the relatively uncorrelated pseudo-random components of error signals Verr produced by two desynchronized divider channels 120 add to give a total increase of pseudo-random noise components of approximately 3 dB in the summed error signal with respect to the individual error signals Verr. Therefore, the increase in the 'desirable' tuning components is greater than the increase in the 'undesirable' pseudo-random noise components in the summed error signal for the same loop bandwidth. In addition, since the sensitivity to the phase detector 126 outputs are reduced proportionately to the increase in tuning components amplitude, the increase in the pseudo-random noise components amplitude is effectively countered by a greater reduction in the sensitivity of the loop itself. The end effect is that summing desynchronized divider channels 120 reduces the pseudo-random noise modulation of the VCO 102 at all frequencies.

Moreover, having the divider channels 120 arranged to have different phase offsets in their outputs, and having the reference frequency inputs to the divider channels 120 similarly offset in phase, maintains the correlation advantage described above, while increasing the effective sampling rate of the tuning information. By not having all divider channels 120 pulse simultaneously, tuning influences occur more frequently and each pulse has a smaller influence. Reference frequency pulses from phase detectors reach the VCO 120 in PLLs and cause reference-frequency sidebands. Furthermore, the polyphase approach of the present invention multiplies the effective reference frequency and also reduces the relative amplitude of reference frequency components.

Figure 5:
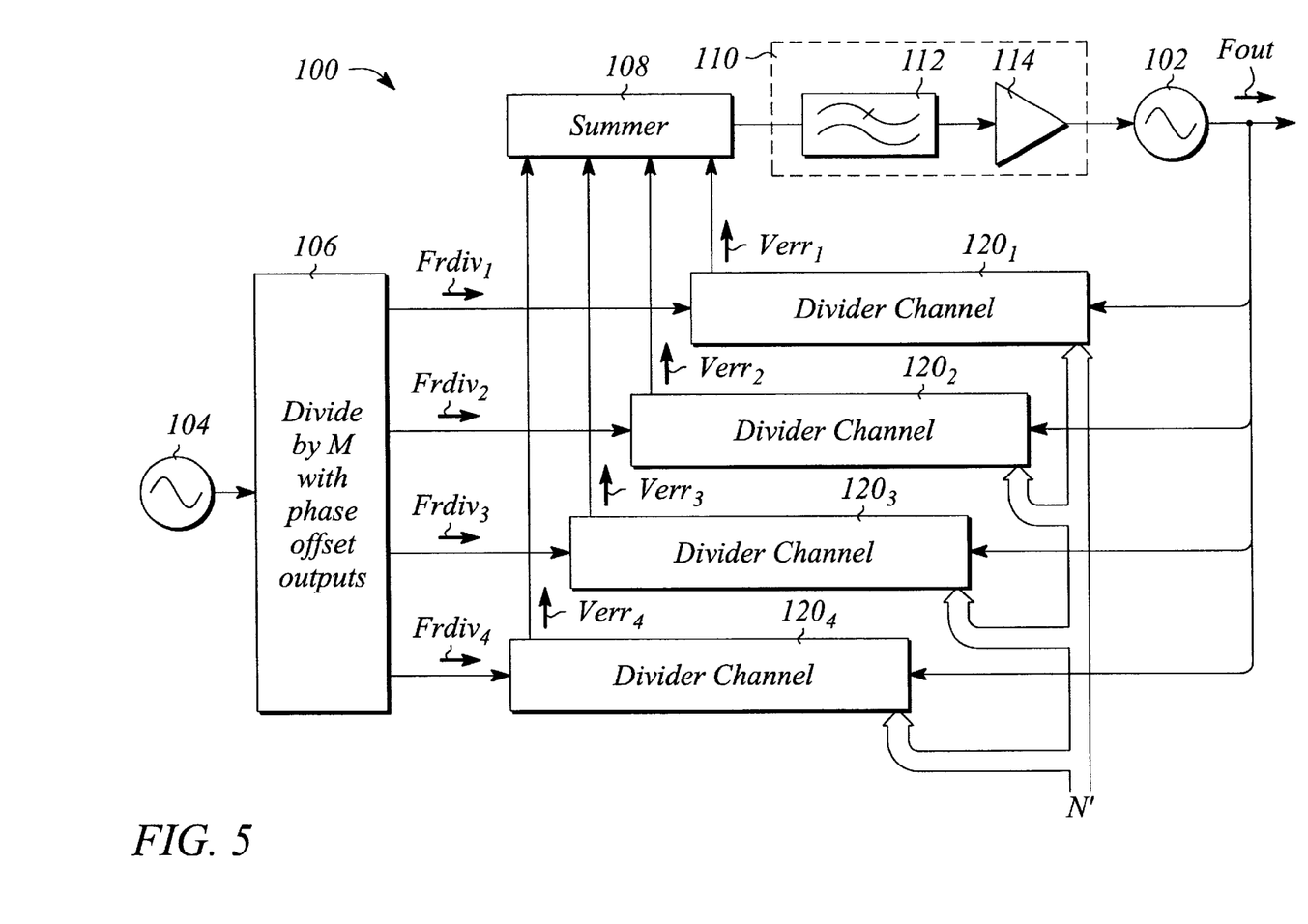
FIG. 5 illustrates a block diagram of an embodiment of a polyphase, noise shaping, fractional-N synthesizer of the present invention having four phase channels.

By way of an example, consider the embodiment of the present invention illustrated in FIG. 5. In this example, there are four divider channels 120 (the number of divider channels in this embodiment is illustrative only). The first divider channel $120_1$ produces a divided signal Fdiv, with a phase shift having a mean value of zero degrees (i. e., the first channel is designated as a mean phase reference for this example). A first output of the reference divider 106 produces a first divided reference signal $Frdiv_1$ with a mean phase shift having equal to zero. The first divided reference signal $Frdiv_1$ is applied to the first divider channel $120_1$ to produce a first error signal $Verr_1$. The divider channel $120_2$ produces a divided signal $Fdiv_2$ that is phase shifted by a mean value of 90 degrees from the mean phase value of $Fdiv_1$. The third divider channel $120_3$ and the fourth divider channel $120_4$ produce divided signals $Fdiv_3$ and $Fdiv_4$ that are phase shifted by mean values of 180 degrees and 270 degrees, respectively, from that of the mean phase value of $Fdiv_1$. A second, third and fourth output of the reference divider 106, likewise produce a second, third and fourth divided reference signal $Frdiv_2$, $Frdiv_3$, and $Frdiv_4$, with phase shifts of 90 degrees, 180 degrees, and 270 degrees, respectively, relative to the first divided reference signal $Frdiv_1$. When the signals $Frdiv_2$, $Frdiv_3$, and $Frdiv_4$ are applied to their respective divider channels $120_2$, $120_3$, $120_4$, error signals $Verr_2$, $Verr_3$ and $Verr_4$ are produced. The four error signals produced by the four divider channels 120 in this example are then added together in the summer 108 to produce a combined error signal.

A number of approaches are available for realizing the phase shifting decorrelation in the fractional-N divider channels 120 of the present invention, including but not limited to, using a phase shifter or time-delay element in each of the divider channels 120. Preferably, the desired mean value of the phase shift can be achieved in each of the divider channels by time-shifting the pseudo-random sequence that is used to vary the frequency divider 122. For example, if a conventional multiple accumulator approach, similar to the one illustrated in FIG. 3, is used to implement the noise-shaping, fractional-N control logic 124, the desired phase shifts of the divider channels 120 can be achieved by controlling the starting value of the first accumulator in each of the divider channels 120. In other words, instead of starting all of the first accumulators at a zero accumulation value, only the accumulator in the first divider channel $120_1$ is started at zero. The first accumulator of each of the other divider channels $120_{2, \ldots, K}$ are each preset to and started at a different, non-zero value. The preset value is chosen such that the time shift in the division factor sequence generated by the cascaded accumulators produces the desired phase shift in the signal Fdiv in each these channels relative to the first channel 120. One skilled in the art would readily recognize that other suitable approaches could be employed to achieve the desired phase shifts. All of these other suitable methods are within the scope of the present invention.

In another embodiment of the synthesizer 100, the desynchronization of the divider channels 120 and concomitant decorrelation of the non-DC components of the error signals $Verr_{1, \ldots, K}$ are accomplished by using different division factor sequences. As is well known in the art, most methods of generating a pseudo-random sequence depend on a seed value. Different seed values produce entirely different, uncorrelated sequences. Therefore, desynchronization of the divider channels 120 can be accomplished by using different seeds for each of the divider channels 120.

In the present invention, the fractional-N control logic 124 produces the time sequence of division factors. The divider channels 120 can be effectively desynchronized by "seeding" the fractional-N control logic 124 of the divider channels 120 with different initial values. Preferably, the different initial values are chosen randomly. Since the fractional-N logic circuits 124 produce what amounts to a pseudo-random or "chaotic" sequence of division factors which are used to control the frequency dividers 122, then starting the sequences with different initial values will result in sequences from each of the fractional-N logic circuits 124 that are highly uncorrelated. When applied to their respective dividers 122 and phase detected by their respective phase detectors 126, these decorrelated sequences will produce error signals Verr that have relatively decorrelated non-DC components. When summed, the Verr signals will combine as described hereinabove for the phase shifted approach. In this embodiment, the divided reference signals applied to each of the fractional-N divider channels are not phase shifted with respect to each other.

For example, if the fractional-N control logic 124 is implemented using the multiple, cascaded accumulators, as described hereinabove, each of the accumulators can be seeded or preset with different initial values. The overflows that result from the operation of the accumulators thus will occur at different times within each of the control logic circuits 124. The difference in timing leads to the decorrelation of the non-DC components of the Verr signal produced by each of the divider channels 120.

In yet another embodiment of synthesizer 100, the fractional-N dividers of the divider channels 120 can be implemented or operated in different ways in each of the divider channels 120 thereby producing the desired decorrelation. For example, a first channel 120 may use three cascaded accumulators in its control logic 124 while a second channel 120 may employ a different number of accumulators, for example two accumulators. By using differing numbers of accumulators in each of the channels 120, the resultant phase-noise in each of the error signals Verr has different, largely decorrelated characteristics. A variation on this theme is to use control logic 124 that produces a different action at an overflow of a given accumulator. The differences in the actions taken by the control logic 124 at the occurrence of an overflow of an accumulator may be varied from one channel 120 to another thereby producing the desired decorrelation.

Yet another way of operating the channels 120 differently to achieve decorrelation involves introducing a different, small random variation in each of the channels 120. For example, if the divider channels 120 are implemented using multiple cascaded accumulators, the operation of the divider channels 120 can be altered by adding a small random values to an input value being applied to, for example, a second accumulator in each channel. By adding different, small random values to each of the second accumulators in each of the channels 120, decorrelation can be achieved.

There are numerous other permutations along these lines that may be employed by one skilled in the art to achieve the differential implementation or differential operation among the plurality of divider channels 120. All of these approaches are within the scope of the present invention.

Advantageously, due to the random-like nature of the noise-shaping of the division factor N' and the desynchronization of the divider channels 120, as described hereinabove, the error signals $Verr_{1, \ldots, K}$ are found to be relatively decorrelated except in the vicinity of DC as discussed hereinabove. In fact, it can be shown that the correlated frequency components of the error signals $Verr_{1, \ldots, K}$ sum as voltages in the summer 108. This means that the frequency components of the summed error signal, corresponding to the correlated components in the error signals $Verr_{1, \ldots, K}$, will increase by approximately 6 dB every time the number of divider channels 120 is doubled. The correlated components of the $Verr_{1, \ldots, K}$ signal represent the desired tuning information ultimately used to control the VCO 102 in the phase locked loop.

On the other hand, the decorrelated frequency components of the error signals $Verr_{1, \ldots, K}$ sum as power in the summer 108. This means that the frequency components of the summed error signals $Verr_{1, \ldots, K}$, corresponding to the uncorrelated components of the error signals $Verr_{1, \ldots, K}$, will increase by approximately 3 dB every time the number of divider channels 120 is doubled. The decorrelated components of the error signals $Verr_{1, \ldots, K}$ represent the unwanted noise that ultimately is responsible for introducing unwanted phase modulation and spurious signals in the VCO output signal Fout which leads to degradation in spectral purity. Therefore, doubling the number of divider channels 120 improves the signal to noise ratio of the summed error signal by approximately 3 dB. Thus, improved spectral purity can be achieved by adding divider channels 120 to the plurality of divider channels 120.

In other words, for the polyphase, noise-shaping, fractional-N synthesizer 100 of the present invention, having two divider channels 120 for example, the increased total output of the combined phase detector outputs (6 dB) requires 6 dB less gain in the rest of the loop to maintain the same overall loop gain and bandwidth as compared to a similar conventional noise-shaping, fractional-N synthesizer. There will be 3 dB more noise, due to the addition of two divider channels 120, but the increased noise will be countered by 6 dB less sensitivity, giving a net 3 dB reduction in the amount of unwanted noise modulating the VCO 102. The theoretical noise reduction of the synthesizer 100 of the present invention is approximately $10Log_{10}(K)$ where K is the number of divider channels 120.

Thus there has been described a novel polyphase, noise-shaping, fractional-N synthesizer 100. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A polyphase, noise shaping, fractional-N frequency synthesizer comprising:
   a voltage controlled oscillator (VCO) having a control input and a VCO output;
   a reference signal source having a plurality of reference outputs;
   a plurality of divider channels connected in parallel, each divider channel being desynchronized relative to others of the plurality of divider channels and having a first channel input connected to the VCO output, a second channel input connected to a different one of the plurality of reference outputs, and a channel output; and
   a loop integrator having an integrator input and an integrator output connected to the control input of the VCO, wherein signals from the channel outputs of the plurality of divider channels are combined together and applied to the loop integrator input.

2. The polyphase, noise shaping, fractional-N frequency synthesizer of claim 1, wherein each desynchronized divider channel comprises:
   a frequency divider having a divider input connected to the first channel input, a variable division factor N and a division factor control input, and a divider output;
   a phase detector having a first detector input connected to the divider output, a second detector input connected to the second channel input, and a detector output connected to the channel output; and
   a fractional-N logic circuit having a logic output connected to the division factor control input of the frequency divider.

3. The polyphase, noise shaping, fractional-N frequency synthesizer of claim 2, wherein each desynchronized divider channel further comprises a pseudo-random variation with respect to time about a mean value applied to the variable division factor N of the frequency divider, the pseudo-random variation being different relative to the pseudo-random variations of the other desynchronized divider channels.

4. The polyphase, noise shaping, fractional-N, frequency synthesizer of claim 2, wherein the VCO produces an output signal Fout at the VCO output that is received at the divider input of the frequency divider in each desynchronized divider channel, the frequency divider divides the frequency of the signal Fout by the variable division factor N and produces a divided signal Fdiv at the divider output, the divided signal Fdiv is received at the first detector input of the phase detector, and
   wherein the reference signal source produces a plurality of different reference signals Frdiv, a different one of the different reference signals Frdiv is received at the second detector input of the phase detector in each desynchronized divider channel, the phase detector compares the respective reference signal Frdiv to the divided signal Fdiv and generates an error signal Verr at the detector output that is a measure of a phase/frequency difference between the signal Frdiv and the signal Fdiv; and
   wherein the division factor N is varied by the fractional-N logic circuit.

5. The polyphase, noise shaping, fractional-N frequency synthesizer of claim 2, wherein each desynchronized divider channel further comprises a divided signal Fdiv having a phase shift and a different reference signal Frdiv having the phase shift, the phase shift being different relative to the phase shifts of the divided signals Fdiv and the different reference signals Frdiv of the other desynchronized divider channels, wherein the phase shift of the reference signal Frdiv and the divided signal Fdiv in a given desynchronized divider channel is approximately equal; and
   wherein the fractional-N logic circuit comprises an initial value that controls the variable division factor N of the frequency divider to produce the phase shift, the initial value being different relative to the initial values of the fractional-N logic circuits of the other desynchronized divider channels.

6. The polyphase, noise shaping, fractional-N frequency synthesizer of claim 5, wherein the fractional-N logic circuit of each desynchronized divider channel further comprises a cascade of digital accumulators, and wherein the initial value is a starting value of the first accumulator of the cascade of accumulators.

7. The polyphase, noise shaping, fractional-N frequency synthesizer of claim 5, wherein the different initial values are used to preset the fractional-N logic circuit of each of the desynchronized divider channels.

8. The polyphase, noise shaping, fractional-N frequency synthesizer of claim 5, wherein the fractional-N logic circuit of each desynchronized divider channel further comprises a cascade of digital accumulators, and wherein a different initial value is applied to each accumulator of the cascade of accumulators as a respective different starting value.

9. The polyphase, noise shaping, fractional-N frequency synthesizer of claim 1, wherein each desynchronized divider channel comprises a divided signal Fdiv having a phase shift and a different reference signal Frdiv having the phase shift, the phase shift being different relative to the phase shifts of the divided signals Fdiv and the other different reference signals Frdiv of the other desynchronized divider channels, and wherein the phase shift of the reference signal Frdiv and the divided signal Fdiv in a given desynchronized divider channel is approximately equal.

10. The polyphase, noise shaping, fractional-N frequency synthesizer of claim 9, wherein the phase shift for adjacent divider channels has a mean value that is approximately equal to 360 degrees divided by the number of divider channels in the plurality of desynchronized divider channels.

11. The polyphase, noise shaping, fractional-N frequency synthesizer of claim 1, wherein the reference signal source comprises a reference signal generator and a reference signal frequency divider that divides a reference signal Fref from the reference signal generator into a plurality of different reference signals Frdiv, a different one of the reference signals Frdiv for each of the plurality of reference outputs.

12. The polyphase, noise shaping, fractional-N, frequency synthesizer of claim 1, wherein the VCO produces an output signal Fout at the VCO output that is received at the first channel input of each desynchronized divider channel, the reference signal source produces a plurality of different reference signals Frdiv, a different one of the plurality of different reference signals Frdiv is received at the second channel input of each desynchronized divider channel, each desynchronized divider channel compares a divided signal Fdiv to a respective reference signal Frdiv, and produces an error signal Verr at the channel output.

13. The polyphase, noise shaping, fractional-N, frequency synthesizer of claim 12 further comprising a signal summer having a plurality of summer inputs and a summer output, each summer input being connected to the channel output of a different one of the plurality of divider channels, wherein the error signals Verr at the channel outputs of the plurality of divider channels are combined by the signal summer to produce a combined error signal, the combined error signal being integrated by the loop integrator to produce a control voltage that controls the frequency of VCO output signal Fout.

14. A polyphase, noise shaping, fractional-N, frequency synthesizer having a voltage controlled oscillator, a reference signal source and a loop integrator in a feedback loop, the voltage controlled oscillator having a control input connected to an integrator output of the loop integrator, the voltage controlled oscillator generating an output signal Fout at an output, the polyphase frequency synthesizer comprising:
- a plurality of noise-shaping, fractional-N divider channels connected in parallel, each divider channel being desynchronized with respect to others of the plurality of divider channels, each divider channel comprising the output signal Fout at a first input, wherein the reference signal source generates a plurality of different reference signals Frdiv and each divider channel further comprises a different one of the reference signals Frdiv at a second input, and an error signal Verr at an output; and
- a signal summer having a plurality of summer inputs, the signal summer comprising the error signals Verr from the outputs of the divider channels at the plurality of summer inputs and a combined error signal at a summer output,
- wherein the loop integrator comprises the combined error signal at an integrator input and a control voltage at the integrator output.

15. The polyphase frequency synthesizer of claim 14, wherein each desynchronized divider channel comprises:
- a frequency divider that comprises a divided signal Fdiv, wherein the divided signal Fdiv is the output signal Fout divided by a variable division factor N;
- fractional-N control logic that comprises a control over the division factor N; and
- a phase detector that comprises the error signal Verr, wherein the error signal Verr is a measure of the phase/frequency difference between the divided signal Fdiv and a respective one of the plurality of reference signals Frdiv.

16. The polyphase frequency synthesizer of claim 15, wherein each desynchronized divider channel further comprises the divided signal Fdiv having a phase shift and the reference signal Frdiv having the phase shift, the phase shift being different relative to phase shifts of the divided signals Fdiv and the other reference signals Frdiv of the other desynchronized divider channels, the phase shift of the reference signal Frdiv and the divided signal Fdiv in a given divider channel being approximately equal; and
wherein the fractional-N control logic comprises an initial value that controls the variable division factor N of the frequency divider to produce the phase shift, the initial value being different relative to the initial values of the fractional-N logic circuits of the other desynchronized divider channels.

17. The polyphase frequency synthesizer of claim 16, wherein the fractional-N control logic of each desynchronized divider channel is a circuit that comprises a cascade of digital accumulators, and wherein the initial value is a starting value of the first accumulator of the cascade of accumulators.

18. The polyphase frequency synthesizer of claim 16, wherein the different initial values are used to preset the fractional-N logic circuit of each of the desynchronized divider channels.

19. The polyphase frequency synthesizer of claim 16, wherein the fractional-N control logic of each desynchronized divider channel is a circuit that comprises a cascade of digital accumulators, and wherein a different initial value is applied to each accumulator of the cascade of accumulators as a respective different starting value.

20. The polyphase frequency synthesizer of claim 15, wherein each desynchronized divider channel further comprises a pseudo-random variation with respect to time about a mean value applied to the variable division factor N of the frequency divider, the pseudo-random variation being different relative to the pseudo-random variations of the other desynchronized divider channels.

21. The polyphase frequency synthesizer of claim 14, wherein each desynchronized divider channel further comprises the divided signal Fdiv having a phase shift and the reference signal Frdiv having the phase shift, the phase shift being different relative to phase shifts of the divided signals Fdiv and the other reference signals Frdiv of the other desynchronized divider channels, and wherein the phase shift of the reference signal Frdiv and the divided signal Fdiv in a given divider channel is approximately equal.

22. The polyphase frequency synthesizer of claim 21, wherein the phase shift for adjacent divider channels has a mean value that is approximately equal to 360 degrees divided by the number of divider channels in the plurality of divider channels.

23. The polyphase frequency synthesizer of claim 14, wherein the reference signal source comprises a reference signal generator and a reference signal frequency divider that divides a reference signal Fref from the reference signal generator into the plurality of different reference signals Frdiv.

24. A polyphase, noise shaping, fractional-N frequency synthesizer comprising:
- a voltage controlled oscillator (VCO) that generates an output signal Fout;
- a reference signal source that generates a plurality of different reference signals Frdiv;
- a plurality of noise shaping, fractional-N divider channels that each generate an error signal Verr at a channel output, wherein the plurality of divider channels are connected in parallel and each divider channel is desynchronized with respect to others of the plurality of divider channels, and wherein each divider channel comprises a frequency divider to generate a divided signal Fdiv that is the signal Fout divided by a variable division factor N, and wherein the error signal Verr is a measure of the phase/frequency difference between the divided signal Fdiv and a different one of the plurality of reference signals Frdiv; and
- a loop integrator that generates a control voltage that is applied to the VCO, the control voltage being the integration of a combined error signal, the combined error signal being a combination of the error signals Verr from the plurality of desynchronized divider channels.

25. The polyphase fractional-N frequency synthesizer of claim 24, wherein each desynchronized divider channel further comprises:
- a phase detector that receives the divided signal Fdiv from the frequency divider and that receives a respective one of the different reference signals Frdiv and produces the error signal Verr at the channel output; and
- a fractional-N logic circuit that controls the variable division factor N used by the frequency divider.

26. The polyphase, fractional-N frequency synthesizer of claim 25, wherein the divided signal Fdiv in the frequency divider of each desynchronized divider channel comprises a phase shift and the different one of the reference signals Frdiv of each desynchronized divider channel comprises the phase shift, the phase shift being different relative to the phase shifts of the divided signals Fdiv and the other different reference signals Frdiv of the other desynchronized divider channels, and wherein the phase shift of the respective reference signal Frdiv and the divided signal Fdiv in a given desynchronized divider channel is approximately equal; and wherein the fractional-N logic circuit of each desynchronized divider channel comprises an initial value to control the variable division factor N of the frequency divider, and the initial value is different relative to the initial values of the fractional-N logic circuits of the other desynchronized divider channels to produce the different phase shifts.

27. The polyphase, fractional-N frequency synthesizer of claim 26, wherein the fractional-N logic circuit of each desynchronized divider channel comprises a cascade of digital accumulators, and wherein the initial value is a starting value of the first accumulator of the cascade of accumulators.

28. The polyphase, noise shaping, fractional-N frequency synthesizer of claim 26, wherein the different initial value is used to preset the fractional-N logic circuit of each of the desynchronized divider channels.

29. The polyphase, fractional-N frequency synthesizer of claim 26, wherein the fractional-N logic circuit of each desynchronized divider channel comprises a cascade of digital accumulators, and wherein a different initial value is applied to each accumulator of the cascade of accumulators as a respective different starting value.

30. The polyphase, fractional-N frequency synthesizer of claim 24, wherein each desynchronized divider channel further comprises a pseudo-random variation with respect to time about a mean value applied to the variable division factor N of the frequency divider, the pseudo-random variation being different relative to the pseudo-random variations of the other desynchronized divider channels.

31. The polyphase, fractional-N frequency synthesizer of claim 24, wherein the divided signal Fdiv in the frequency divider of each desynchronized divider channel comprises a phase shift and the different one of the reference signals Frdiv of each desynchronized divider channel comprises the phase shift, the phase shift being different relative to the phase shifts of the divided signals Fdiv and the other different reference signals Frdiv of the other desynchronized divider channels, and wherein the phase shift of the respective reference signal Frdiv and the divided signal Fdiv in a given desynchronized divider channel is approximately equal.

32. The polyphase fractional-N frequency synthesizer of claim 31, wherein the phase shift for adjacent divider channels has a mean value that is approximately equal to 360 degrees divided by the number of divider channels in the plurality of desynchronized divider channels.

33. The polyphase, fractional-N frequency synthesizer of claim 24, wherein the reference signal source comprises a reference signal generator and a reference signal frequency divider that divides a reference signal Fref from the reference signal generator into the plurality of different reference signals Frdiv.

34. The polyphase, fractional-N frequency synthesizer of claim 24, further comprising a signal summer that generates the combined error signal, the signal summer being connected between the channel outputs of the plurality of divider channels and the loop integrator.

35. A noise shaping, fractional-N frequency synthesizer comprising:

a plurality of fractional-N divider channels connected in parallel, each divider channel being desynchronized relative to others of the plurality of divider channels.

36. The synthesizer of claim 35, wherein the desynchronization of the divider channels in the plurality decorrelates noise produced by the channels.

37. The synthesizer of claim 35, wherein each desynchronized divider channel comprises a divided signal Fdiv having a phase shift, the phase shift being different relative to phase shifts of the other divided signals Fdiv, and wherein reference signals Frdiv applied to each of the respective desynchronized divider channels each have a phase shift, the phase shift of the reference signal Frdiv and the phase shift of the divided signal Fdiv in a given divider channel being approximately equal.

38. The synthesizer of claim 35, wherein each desynchronized divider channel comprises a fractional-N logic circuits a different initial value being used to preset the fractional-N logic circuit of each of the desynchronized divider channels.

39. The synthesizer of claim 35, wherein each desynchronized divider channel comprises a frequency divider, and a pseudo-random variation with respect to time about a mean value applied to a variable division factor N of the frequency divider, the pseudo-random variation being different relative to the pseudo-random variations of the other desynchronized divider channels.

* * * * *